United States Patent
Bhagavat et al.

(10) Patent No.: US 9,236,442 B2
(45) Date of Patent: Jan. 12, 2016

(54) INTEGRATION OF CHIPS AND SILICON-BASED TRENCH CAPACITORS USING LOW PARASITIC SILICON-LEVEL CONNECTIONS

(71) Applicant: Broadcom Corporation, Irvine, CA (US)

(72) Inventors: Milind S. Bhagavat, Fremont, CA (US); Sampath Komarapalayam Velayudham Karikalan, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 54 days.

(21) Appl. No.: 13/725,699

(22) Filed: Dec. 21, 2012

(65) Prior Publication Data
US 2014/0145300 A1     May 29, 2014

Related U.S. Application Data

(60) Provisional application No. 61/729,923, filed on Nov. 26, 2012.

(51) Int. Cl.
*H01L 29/00*     (2006.01)
*H01L 29/66*     (2006.01)
(Continued)

(52) U.S. Cl.
CPC ........ *H01L 29/66181* (2013.01); *H01L 21/486* (2013.01); *H01L 21/76898* (2013.01); *H01L 23/49816* (2013.01); *H01L 23/49822* (2013.01); *H01L 23/49827* (2013.01); *H01L 25/16* (2013.01); *H01L 27/0805* (2013.01); *H01L 29/945* (2013.01); *H01L 21/568* (2013.01); *H01L 23/147* (2013.01); *H01L 23/49811* (2013.01); *H01L 24/05* (2013.01); *H01L 24/06* (2013.01); *H01L 24/13* (2013.01); *H01L 24/14* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/0557* (2013.01); *H01L 2224/05572* (2013.01); *H01L 2224/06181* (2013.01); *H01L 2224/131* (2013.01); *H01L 2224/13082* (2013.01);
(Continued)

(58) Field of Classification Search
CPC ..... H01L 2924/00; H01L 27/04; H01L 21/77; H01L 2224/48227; H01L 2224/73265
USPC ................... 257/532; 438/107, 386
See application file for complete search history.

(56) References Cited

U.S. PATENT DOCUMENTS 6,180,480 B1 *   1/2001   Economikos et al. ........ 438/386
6,821,802 B2 *   11/2004   Ahn et al. ....................... 438/27
(Continued)

*Primary Examiner* — Andy Huynh
(74) *Attorney, Agent, or Firm* — Fiala & Weaver P.L.L.C.

(57) ABSTRACT

Methods and apparatuses are described for integration of integrated circuit die and silicon-based trench capacitors using silicon-level connections to reduce connection lengths, parasitics and necessary capacitance magnitudes and volumes. A trench capacitor can be fabricated on silicon and mounted on or embedded in a chip or one or more sides of a through silicon interposer (TSI) for silicon-level connections to chip circuitry. Aspect ratio dependent, as opposed to trench diameter or trench depth dependent, trench capacitors formed by a dense array of high aspect ratio trenches with thin, high permittivity dielectric increase capacitance per unit area and volume, resulting in thin, high capacitance trench capacitors having thickness equal to or less than chip thickness.

20 Claims, 9 Drawing Sheets

(51) Int. Cl.
   *H01L 27/08*    (2006.01)
   *H01L 29/94*    (2006.01)
   *H01L 21/48*    (2006.01)
   *H01L 25/16*    (2006.01)
   *H01L 21/768*   (2006.01)
   *H01L 23/14*    (2006.01)
   *H01L 23/498*   (2006.01)
   *H01L 21/56*    (2006.01)
   *H01L 23/00*    (2006.01)

(52) U.S. Cl.
   CPC ............ *H01L 2224/13147* (2013.01); *H01L 2224/14181* (2013.01); *H01L 2224/16145* (2013.01); *H01L 2224/16225* (2013.01); *H01L 2224/16265* (2013.01); *H01L 2224/32225* (2013.01); *H01L 2224/73204* (2013.01); *H01L 2224/81005* (2013.01); *H01L 2224/92125* (2013.01); *H01L 2224/94* (2013.01); *H01L 2924/00014* (2013.01); *H01L 2924/10253* (2013.01); *H01L 2924/1305* (2013.01); *H01L 2924/13091* (2013.01); *H01L 2924/1461* (2013.01); *H01L 2924/15311* (2013.01); *H01L 2924/18161* (2013.01); *H01L 2924/19041* (2013.01); *H01L 2924/19104* (2013.01); *H01L 2924/19105* (2013.01); *H01L 2924/19106* (2013.01)

(56) References Cited

U.S. PATENT DOCUMENTS

| | | | |
|---|---|---|---|
| 7,034,401 B2 * | 4/2006 | Savastiouk et al. | 257/778 |
| 2009/0085217 A1 * | 4/2009 | Knickerbocker et al. | 257/774 |
| 2014/0070404 A1 * | 3/2014 | Sheu et al. | 257/737 |

* cited by examiner

INTEGRATION OF CHIPS AND SILICON-BASED TRENCH CAPACITORS USING LOW PARASITIC SILICON-LEVEL CONNECTIONS

This application claims the benefit of U.S. Provisional Application No. 61/729,923, filed on Nov. 26, 2012, which is incorporated by reference herein in its entirety.

BACKGROUND

Decoupling capacitors are often relatively large capacitors necessary to decouple one circuit (e.g., a power supply) from another circuit. Decoupling capacitors are often connected to an integrated circuit die or chip through the chip's package and through a substrate, such as a printed circuit board (PCB). These relatively long connections increase the equivalent series resistance (ESR) and equivalent series inductance (ESL) of decoupling capacitors, which in turn increases the magnitude of capacitance necessary to decouple circuits. Discrete decoupling capacitors are often 500 um thick or thicker, which is considerably thicker than integrated circuit chips.

BRIEF SUMMARY

Methods, systems, and apparatuses are described for the integration of silicon-based trench capacitors with integrated circuit chips/dies, integrated circuit packages, and integrated circuit package interposers, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 1:
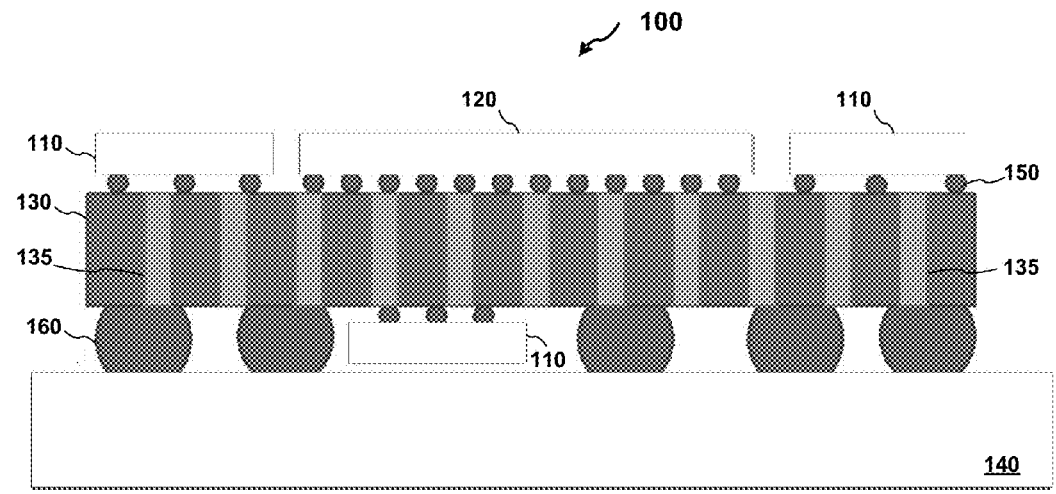
FIG. 1 shows a cross-sectional view of an exemplary embodiment of a device integrating a chip and silicon-based trench capacitors using silicon level connections on a through silicon interposer.

Embodiments are described as follows with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Reference is made herein to embodiments that incorporate features of the described and claimed subject matter, examples of which are illustrated in the accompanying drawings. While the technology is described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Particular terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection or through an indirect electrical connection via other devices and connections.

Spatial descriptions (e.g., "above", "below", "left," "right," "up", "down", "top", "bottom", etc.) are for purposes of illustration only. Each of many practical implementations of the structures described herein can be spatially arranged in any orientation or manner. Microns shall be used to refer to millionths of a meter or μm. Despite the description herein of silicon as a semiconductor material, any suitable semiconductor material may be used to implement an embodiment.

II. Exemplary Integration of Chips and Silicon-Based Trench Capacitors Using Low Parasitic Silicon-Level Connections Methods, systems, and apparatuses are described as follows for integration of chip dies and silicon-based trench capacitors using silicon-level connections that reduce connection lengths, parasitics and necessary magnitudes and volumes of decoupling capacitors. A trench capacitor can be fabricated on silicon and mounted on or embedded in a chip or one or more sides of a through silicon interposer (TSI) for silicon-level connections to chip circuitry. Aspect ratio dependent (as opposed to trench diameter or trench depth dependent) trench capacitors formed by a dense array of high aspect ratio trenches with a thin, high permittivity dielectric increase capacitance per unit area and volume, resulting in thin, high capacitance trench capacitors having a thickness equal to or less than a chip thickness.

In one embodiment, a device includes an assembly of components on a through silicon interposer (TSI) having first and second opposing surfaces. An active integrated circuit (IC) die may be mounted to the first surface of the TSI. A first silicon-based trench capacitor may also be mounted to the first surface of the TSI. The first silicon-based trench capacitor may be fabricated independent of the active IC die and TSI on a separate silicon wafer using a specific process for trench capacitors. A first silicon-level electrical connection between the active IC die and the first trench capacitor is provided by the TSI. In addition to surface mounting, a silicon-based trench capacitor may be embedded in the TSI. A silicon-level electrical connection between the active IC die and the embedded trench capacitor may be provided by the TSI.

A second silicon-based trench capacitor fabricated independent of the IC die may be mounted to the second surface of the TSI. A second silicon-level electrical connection between the active IC die and the second trench capacitor may be provided by the TSI. The second surface of the TSI may be mounted to a substrate (e.g., a printed circuit board (PCB)). The thickness of the second silicon-based trench capacitor may be less than the thickness of connections (e.g., solder ball connections) between the TSI and substrate. Silicon-level electrical connections may be formed by vias and/or traces on the TSI.

A silicon-based trench capacitor may include a dense array of interconnected trench capacitors. Each trench in the array may be fabricated by forming a blind via with a high aspect ratio of trench depth to trench diameter. In addition to a high aspect ratio, capacitance is also increased by a thin dielectric with high relative permittivity. A thickness of the first silicon-based trench capacitor may be less than or equal to a thickness of the active IC die, and may be much thinner than traditional discrete capacitors.

In another embodiment, a device includes a composite die formed on an active IC die having first and second opposing surfaces. The second surface may include electrical connections (e.g., flip chip connections) to connect to a substrate. A first silicon-based trench capacitor may also be mounted to the first surface of the active IC die. The first silicon-based trench capacitor may be fabricated independent of the active IC die on a separate silicon wafer using a specific process for trench capacitors. A first silicon-level electrical connection between the active IC die and the first trench capacitor is provided by the active IC die. In addition to surface mounting, a silicon-based trench capacitor may be embedded in the active IC die. A silicon-level electrical connection between the active IC die and the embedded trench capacitor may be provided by the TSI. The silicon-level electrical connection may include a Through Silicon Via (TSV).

In another embodiment, a method includes fabricating an active IC die having first and second opposing surfaces, fabricating a first silicon-based trench capacitor comprising an array of blind via trenches, and forming a first silicon-level electrical connection between the active IC die and the first silicon-based trench capacitor.

The method may further include mounting the active IC die and the first silicon-based trench capacitor to a Through Silicon Interposer (TSI) having first and second opposing surfaces. The first silicon-based trench capacitor may be fabricated independent of the active IC die. The first silicon-level electrical connection may be formed in the TSI. The method may further include mounting a second silicon-based trench capacitor to the second surface of the TSI and mounting second surface of the TSI to a substrate. Alternatively or additionally, the method may further include embedding the first silicon-based trench capacitor in the TSI.

In some embodiments, fabricating the first silicon-based trench capacitor may include fabricating a composite die by fabricating the first silicon-based trench capacitor independent of the active IC die and mounting the first silicon-based trench capacitor to a first surface of the active IC die. In some embodiments, fabricating a first silicon-based trench capacitor may include embedding the first silicon-based trench capacitor within the active IC die.

In some embodiments, forming the first silicon-level electrical connection may include forming a through silicon via (TSV) in the active IC die, and electrically connecting the first silicon-based trench capacitor and the active IC die through the TSV.

An advantage of silicon-based trench capacitors is that there is little to no thermal mismatch between capacitor silicon, active IC dies, TSIs, and silicon-level connections between them because they each include a same material—silicon. A further advantage of silicon-based trench capacitors is that they can be fabricated significantly thinner than discrete equivalents. This permits integration with active IC dies and TSIs. An advantage of fabricating silicon-based trench capacitors independently of an active IC die and TSIs is that decoupling capacitors can be made on separate silicon wafers using a process specific to trench capacitors. This permits process optimization. An advantage of placing active IC dies and TSIs in close proximity to silicon-based trench capacitors is silicon-level connections that result in shorter connections that do not go through packages. This reduces effective ESR and ESL. It also reduces the magnitude of capacitance required for decoupling. An advantage of high aspect ratio and thin, high permittivity dielectric silicon-based trench capacitors is that they can increase the capacitance per unit area and per unit volume.

Embodiments may be implemented in various configurations. For instance, FIG. 1 shows a cross-sectional view of an exemplary embodiment of a device 100 integrating a chip and silicon-based trench capacitors using silicon level connections. Specifically, FIG. 1 illustrates the cross-sectional view structure of an integration embodiment using a passive TSI. Because this is a cross-sectional view, note that connections that appear to be aligned in one dimension may not be aligned in another dimension.

As shown in FIG. 1, device 100 includes trench capacitor 110, active IC die or chip 120, TSI 130 and substrate 140. Trench capacitor 110 is mounted and electrically connected to TSI 130 by micro-bumps 150. Specifically, in this embodiment, two trench capacitors 110 are mounted to a first surface of TSI 130 and one trench capacitor 110 is mounted to a second surface of TSI 130. Chip 120 is mounted and electrically connected to TSI 130 by micro-bumps 150. The second surface of TSI 130 is mounted and electrically connected to substrate 140 by solder bumps 160. Device 100 or a portion thereof, such as trench capacitor 110, chip 120 and TSI 130, may be covered in an encapsulate, mold compound, or epoxy (not shown) for mechanical and environmental protection.

Trench capacitor 110 includes a silicon-based trench capacitor. In some embodiments, trench capacitor 110 may include, for example, a decoupling capacitor for chip 120 while in other embodiments trench capacitor may serve a different purpose. In some embodiments, trench capacitor 110 may be fabricated independent of chip 120 and TSI 130. Trench capacitor 110 may be made on a separate silicon wafer using a process specific to trench capacitors. In the same or other embodiments, trench capacitor 110 may also be mounted to chip 120, embedded in chip 120 and/or embedded in TSI 130.

Trench capacitor 110 may include a dense array of interconnected trench capacitors. Each trench in the array may be fabricated by sandwiching a thin, high permittivity dielectric between two conductors in a blind via with a high aspect ratio of trench depth to trench diameter. Aspect ratio dependency, as opposed to depth dependency, permits trench capacitor 110 to be very thin. For example, in some embodiments, the aspect ratio of trenches or blind vias in trench capacitor 110 may be 25, which is 25 units of length to 1 unit of diameter. Other embodiments may employ different aspect ratios. In some embodiments, the thickness of trench capacitor 110 may be 50 microns. Other embodiments may employ trench capacitors having larger or smaller thicknesses. As a result, at least in some embodiments, the thickness of trench capacitor 110 may be less than or equal to the thickness of chip 120 and much thinner than traditional discretely fabricated capacitors.

Thin, high aspect ratio trenches increase capacitance density by volume and may maintain or increase capacitance density by area relative to traditional discrete capacitors. Trenches may be very dense. In some embodiments, trench or blind via diameters and spacing between them may be 1 micron. In other embodiments, trench diameter and spacing may be more or less than 1 micron, and diameter and spacing may be equal or different.

In some embodiments, layers forming trench capacitor 210 may include a first or bottom trench electrode comprising polycrystalline silicon (polysilicon), a dielectric comprising thermal oxide or oxide-nitride-oxide (ONO) composite film, and a second or top electrode comprising copper. In other embodiments, trench capacitor layers may be configured differently using the same or different materials. In some embodiments, an ONO dielectric film may be as thin as approximately 1 nanometer (nm) without electrically leaking. In other embodiments, dielectric thickness may be more or less than 1 nm.

Chip 120 may include any semiconductor chip. Chip 120 is a die without packaging to permit silicon-level connections. TSI 130 includes a passive semiconductor fabricated to connect components together. TSI 130 provides silicon-level connections between trench capacitor 110 and chip 120. Connections between components may be made by traces and/or vias. Vias 135 and/or traces (not shown) combined with micro-bumps 150 and solder bumps 160 couple one or more trench capacitors 110 to chip 120 and substrate 140. Substrate 140 may include, for example, a PCB or other type of circuit board. Substrate 140 may be fabricated to couple many components together.

Micro-bumps 150 and solder bumps 160 are connections that couple conductive regions on trench capacitor 110, chip 120, TSI 130 and substrate 140. Micro-bumps 150 couple conductive regions of trench capacitor 110 to conductive regions of TSI 130. Solder bumps 160 couple conductive regions of TSI 130 to conductive regions of substrate 140. Micro-bumps 150 and solder bumps 160 can be formed out of an electrically conductive material such as solder. Micro-bumps 150 and solder bumps 160 may be flip chip or C4 connections. Although FIG. 1 is not intended to be drawn to scale, for perspective, in some embodiments, solder bumps 160 may be 200 microns tall and micro-bumps 150 may be 20 microns tall. Of course, dimensions of components and connections may vary between embodiments. Other embodiments may use connections other than micro-bumps 150 and solder bumps 160. Encapsulation, molding and/or underfill material such as epoxy (not shown) may physically fill the spaces between trench capacitors 110, chip 120, TSI 130, substrate 140, micro-bumps 150 and solder bumps 160.

Figure 2:
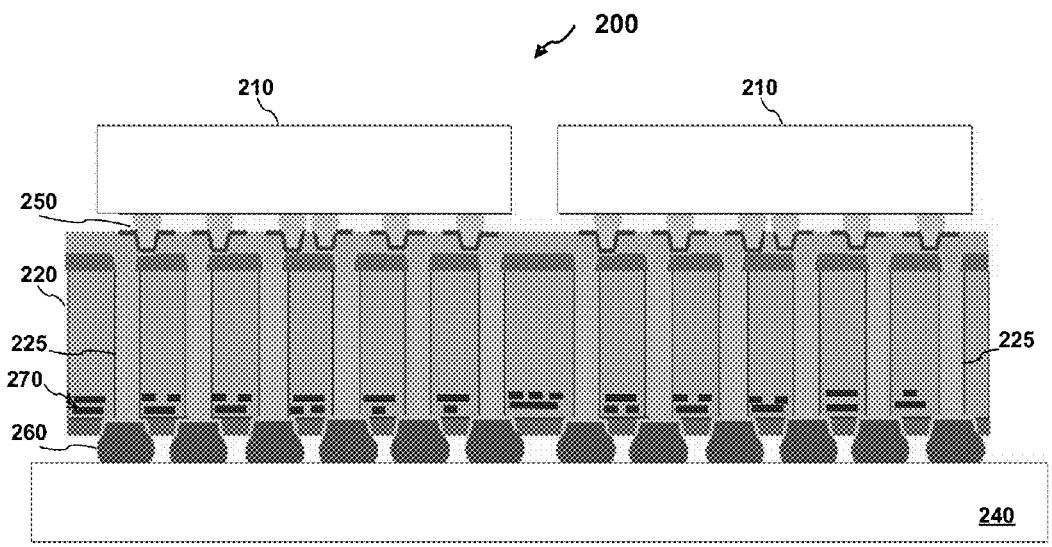
FIG. 2 shows a cross-sectional view of an exemplary embodiment of a device integrating a chip and silicon-based trench capacitors using silicon level connections on an active transistor chip with through silicon vias.

FIG. 2 shows a cross-sectional view of an exemplary embodiment of a device 200 integrating a chip and silicon-based trench capacitors using silicon level connections. Specifically, FIG. 2 illustrates the cross-sectional view structure of an integration embodiment without using a passive TSI. Because this is a cross-sectional view, note that connections that appear to be aligned in one dimension may not be aligned in another dimension.

Device 200 includes first and second trench capacitors 210, active IC die or chip 220 and substrate 240. Each trench capacitor 210 is mounted and electrically connected to chip 220 by micro-bumps 250. Specifically, in this embodiment, micro-bumps 250 mount and electrically couple two trench capacitors to a first surface of chip 220. The second surface of chip 240 is mounted and electrically connected to substrate 240 by solder bumps 260. Device 200 or a portion thereof, such as trench capacitors 210 and chip 220, may be covered in an encapsulate, mold compound, or epoxy (not shown) for mechanical and environmental protection. A trench capacitor 210 mounted to chip 220 may be referred to as a composite die.

Trench capacitors 210 each include a silicon-based trench capacitor. In some embodiments, a trench capacitor 210 may include, for example, a decoupling capacitor for chip 220 while in other embodiments a trench capacitor may serve a different purpose. In some embodiments, trench capacitors 210 may be fabricated independent of chip 220. Trench capacitors 210 may be made on a separate silicon wafer using a process specific to trench capacitors. In the same or other embodiments, one or more trench capacitors 210 may also be embedded in chip 220.

Trench capacitor 210 may include a dense array of interconnected trench capacitors. Each trench in the array may be fabricated by sandwiching a thin, high permittivity dielectric between two conductors in a blind via with a high aspect ratio of trench depth to trench diameter. Aspect ratio dependency, as opposed to depth dependency, permits trench capacitor 210 to be very thin. For example, in some embodiments, the aspect ratio of trenches or blind vias in trench capacitor 210 may be 25, which is 25 units of length to 1 unit of diameter. Other embodiments may employ different aspect ratios. In some embodiments, the thickness of trench capacitor 210 may be 50 microns. Other embodiments may employ trench capacitors having larger or smaller thicknesses. As a result, at least in some embodiments, the thickness of trench capacitor 210 may be less than or equal to the thickness of chip 220 and much thinner than traditional discretely fabricated capacitors.

Thin, high aspect ratio trenches increase capacitance density by volume and may maintain or increase capacitance density by area relative to traditional discrete capacitors. Trenches may be very dense. In some embodiments, trench or blind via diameters and spacing between them may be 1 micron. In other embodiments, trench diameter and spacing may be more or less than 1 micron and diameter and spacing may be equal or different.

In some embodiments, layers forming trench capacitor 210 may include a first or bottom trench electrode comprising polycrystalline silicon (polysilicon), a dielectric comprising thermal oxide or ONO composite film, and a second or top electrode comprising copper. In other embodiments, trench capacitor layers may be configured differently using the same or different materials. In some embodiments, an ONO dielectric film may be as thin as approximately 1 nanometer (nm) without electrically leaking. In other embodiments, dielectric thickness may be more or less than 1 nm.

Chip 220 may include any semiconductor chip. Chip 220 is a die without packaging to permit silicon-level connections. In this embodiment, chip 220 includes a flip chip die. Chip 220 provides silicon-level connections between trench capacitor 210 and chip 220. Silicon-level connections include, for example, through silicon vias (TSVs) 225 combined with micro-bumps 250 and solder bumps 260. One or more silicon-level connections couple one or more trench capacitors 210 to chip 220 and substrate 240. In this embodiment, TSVs are formed through an active surface of chip 220 to a back side of chip 220 where micro-bumps 250 and flip chip solder bumps 260 mount and electrically connect trench capacitors 210 to active circuitry 270 in chip 220. Substrate 240 may include, for example, a PCB or other type of circuit board. Substrate 240 may be fabricated to couple many components together.

Micro-bumps 250 and solder bumps 260 are connections that couple conductive regions on trench capacitor 210, chip 220 and substrate 240. Micro-bumps 250 couple conductive regions of trench capacitor 210 to conductive regions of chip 240. Solder bumps 260 couple conductive regions of chip 220 to conductive regions of substrate 240. Micro-bumps 250 and solder bumps 260 can be formed out of an electrically conductive material such as solder. Micro-bumps 250 and solder bumps 260 may be flip chip or C4 connections. It is noted that FIG. 2 is not intended to be drawn to scale. Dimensions of components and connections may vary between embodiments. Other embodiments may use connections other than micro-bumps 250 and solder bumps 260. Encapsulation, molding and/or underfill material such as epoxy (not shown) may physically fill the spaces between trench capacitors 210, chip 220, substrate 240, micro-bumps 250 and solder bumps 260.

Figure 3:
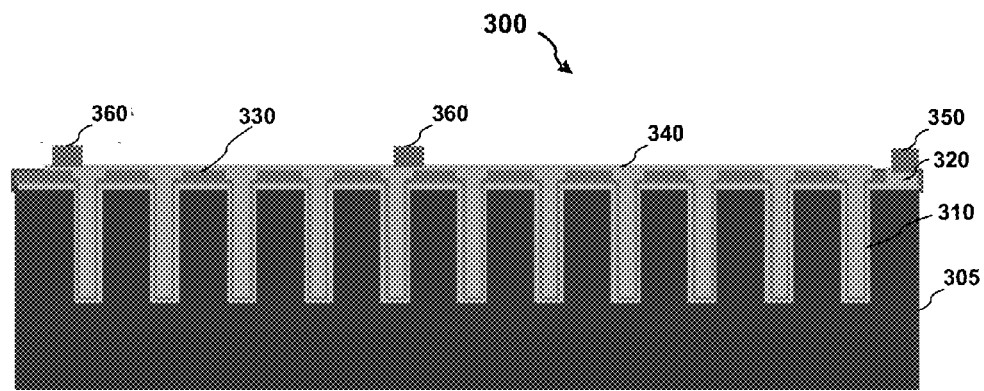
FIG. 3 shows a cross-sectional view of an exemplary embodiment of a silicon-based trench capacitor.

FIG. 3 shows a cross-sectional view of an exemplary embodiment of a silicon-based trench capacitor 300. Trench capacitor 300 includes an array of filled trenches or blind vias in a semiconductor 305. More specifically, trench capacitor 300 includes trenches 310, a first or bottom conductive layer 320 lining trenches 310, a dielectric layer 330, a second or top conductive layer 340, a first connector 350 electrically connected to bottom layer 320, and a second connector 360 electrically connected to top layer 340. It can be seen that a trench capacitor is formed by dielectric 330 sandwiched between first and second conductors 320, 340. Relative to a two-dimensional plate capacitor, trenches 310 expand the surface area of the capacitor into a third dimension, thereby increasing capacitance. FIG. 3 is not intended to be drawn to scale. Dimensions of components and connections may vary between embodiments.

In some embodiments, first or bottom conductive layer or electrode 320 may include polysilicon, dielectric layer 330 may include thermal oxide or ONO, and second or top conductive layer or electrode 340 may include copper. In other embodiments, trench capacitor layers may be configured differently using the same or different materials.

The capacitance per unit area of a trench capacitor 300 is aspect ratio dependent. Aspect ratio is defined as the ratio of depth of the trench and its diameter. A higher aspect ratio for the trenches produces a higher capacitance per unit area. In some embodiments, an ONO dielectric film may be as thin as approximately 1 nanometer (nm) without electrically leaking, in order to further increase the capacitance per unit area. In other embodiments, dielectric thickness may be more or less than 1 nm.

Aspect ratio dependency, as opposed to depth dependency, permits trench capacitor 300 to be very thin. For example, in some embodiments, the aspect ratio of trenches or blind vias in trench capacitor 300 may be 25, which is 25 units of length to 1 unit of diameter. Other embodiments may employ different aspect ratios. In some embodiments, the thickness of trench capacitor 300 may be 50 microns. Other embodiments may employ trench capacitors having larger or smaller thicknesses.

Thin, high aspect ratio trenches increase capacitance density by volume and may maintain or increase capacitance density by area relative to traditional discrete capacitors. Trenches may be very dense. In some embodiments, trench or blind via diameters and spacing between them may be 1 micron or 2 microns on center. In other embodiments, trench diameter and spacing may be more or less than 1 micron and diameter and spacing may be equal or different.

Figure 4:
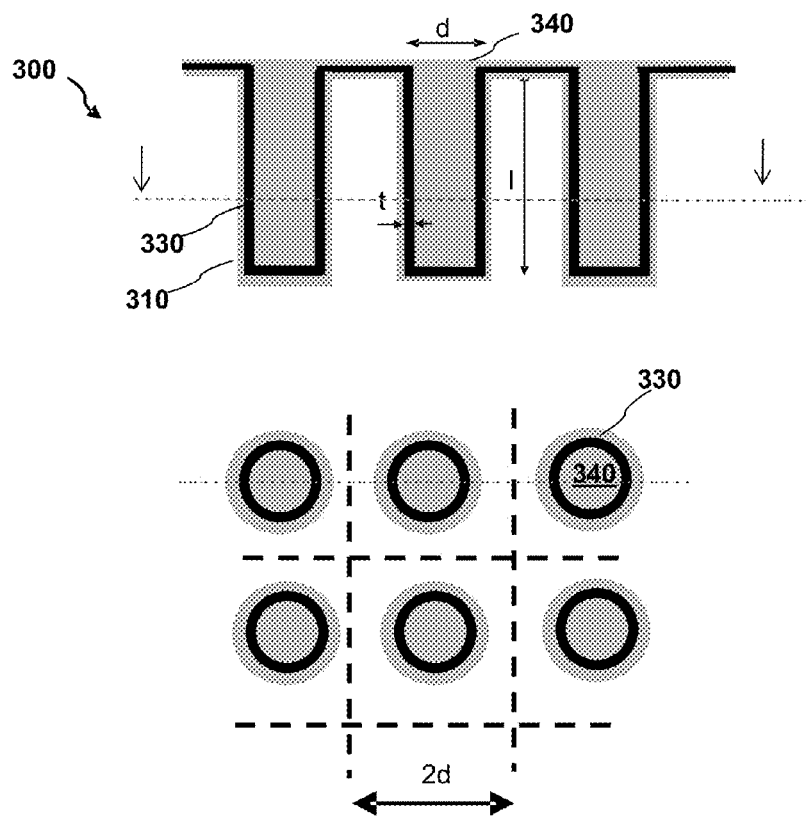
FIG. 4 shows a cross-sectional view of an exemplary embodiment of an aspect ratio dependent silicon-based trench capacitor.

FIG. 4 shows a cross-sectional view of an exemplary embodiment of an aspect ratio dependent silicon-based trench capacitor. FIG. 4 provides a cross sectional side view of a three trenches 310 in trench capacitor 300, and a cross sectional top view of six trenches 310 in an array of trenches in trench capacitor 300. The depth of each trench or blind via capacitor without regard to the capacitor area at the bottom of the trench is represented by l, the diameter of the inner surface of dielectric 330 in each trench or blind via without regard to the thickness of the dielectric or the first or bottom conductive layer 320 is given by d, and the thickness of dielectric layer 330 (i.e. the separation between conductive layers) in each trench is given by t. Dashed lines define an array of square unit areas, each with a trench in the center. In this embodiment, an array of blind vias each have a diameter d plus the thickness of dielectric layer 330 plus the thickness of first or bottom conductive layer 320. The location of the center of each blind via is 2d+t on center and each unit area is 2d by 2d. Thus, the area of each unit area is $4d^2$.

Capacitance may be approximately analyzed using simplified Equations 1.1-1.5. Aspect ratio a is given by Equation 1.1. The area of a trench sidewall of a single blind via $A_s$ is given by Equation 1.2. Capacitance of a sidewall in a single blind via $C_S$ is given by Equation 1.3. Note that Equation 1.3 calculates capacitance for parallel plates rather than for an annular area. The parallel plate equation is applicable so long as dielectric 330 is sufficiently thin. Capacitance of a sidewall in a single blind via $C_S$ per (divided by) a single square unit area $C_{S_U}$ is given by Equation 1.4. Total capacitance of a total area A provided by the combination of trench capacitors and the area at the top and bottom of trenches $C_T$ is given by Equation 1.5. $\pi$ is the ratio of a circle's circumference to its diameter, which has a constant value approximately equal to 3.14159. $\epsilon_0$ is the permittivity of free space, i.e., electric constant, having a constant value of $8.85418 \times 10^{-12}$ F/m. $\epsilon_r$ is the relative permittivity of a dielectric material at zero frequency (i.e., dielectric constant or static relative permittivity).

$$a = \frac{l}{d} \quad \text{Equation 1.1}$$

$$A_s = \pi dl \quad \text{Equation 1.2}$$

$$C_S = \frac{\varepsilon_0 \varepsilon_r \pi dl}{t} \quad \text{Equation 1.3}$$

$$C_{S_U} = \frac{\varepsilon_0 \varepsilon_r \pi dl}{t 4 d^2} = \frac{\varepsilon_0 \varepsilon_r \pi a}{4t} \quad \text{Equation 1.4}$$

$$C_T = C_{S_U} A + \frac{\varepsilon_0 \varepsilon_r A}{t} = \frac{\varepsilon_0 \varepsilon_r A}{t}\left(1 + \frac{\pi a}{4}\right) \quad \text{Equation 1.5}$$

As Equations 1.3 and 1.5 show, blind via diameter alone and blind via depth alone do not matter. What matters is aspect ratio a for each blind via. This indicates that trench capacitors may be shallow and still achieve high capacitance by using a high aspect ratio and a thin dielectric with high relative permittivity. The density of blind vias also contributes to capacitance over a given area A.

Assuming that higher capacitance in a smaller area or volume is desired, one may conclude that, the thinner the dielectric the better, the higher the relative permittivity of the dielectric the better, and the higher the aspect ratio a of a via the better. Assuming that reduction of ESR and ESL is desired, one may also conclude that the higher the conductivity of the second or top conductive layer 340 the better, and the lower the contact resistance between the second or top conductive layer 340 and the second or top electrode 360 the better.

Embodiments may also be implemented in processes or methods. FIGS. 5, 6A-6G, and 7A-7N show a few exemplary methods that may be used, among other methods, to fabricate and/or assemble the components, devices or apparatuses shown in FIGS. 1-4. Embodiments in FIGS. 1-4 and other embodiments may be fabricated or assembled according to the same or other methods. Other embodiments will be apparent to persons skilled in the relevant art(s) based on the foregoing discussion of embodiments. No order of steps is required unless expressly indicated or inherently required. There is no requirement that a method embodiment implement all of the steps illustrated in one or more of FIGS. 5, 6A-6G, and 7A-7N. FIGS. 5, 6A-6G, and 7A-7N are simply a few of many possible embodiments. Embodiments may implement fewer, more or different steps.

Figure 5:
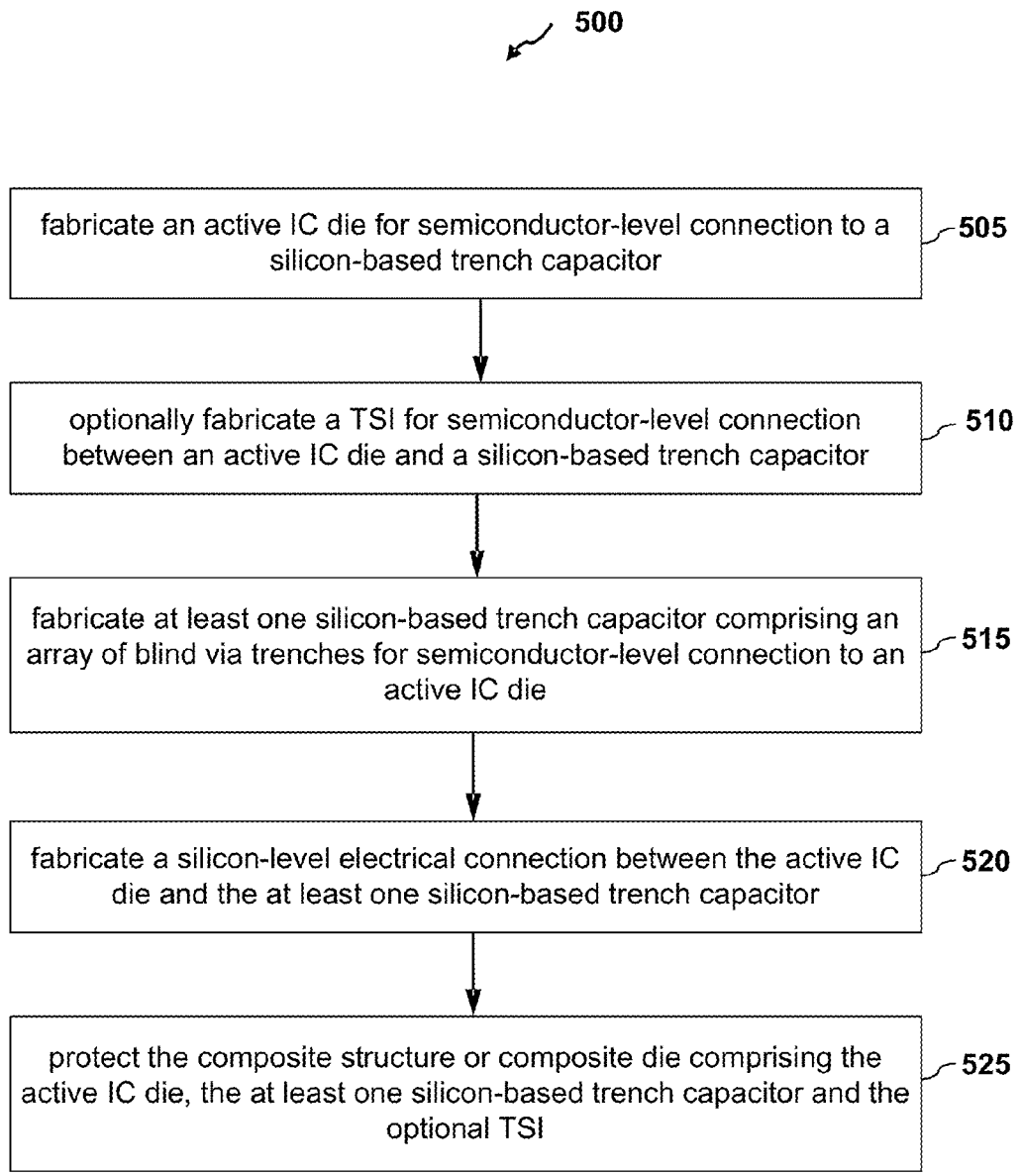
FIG. 5 shows a flowchart providing a process for integrating a chip and a silicon-based trench capacitor using silicon-level connections.

FIG. 5 shows an exemplary embodiment of a method of integrating a chip and a silicon-based trench capacitor using silicon-level connections. Method 500 includes steps 505 to 515. Method 500 begins with step 505. In step 505, an active IC die having first and second opposing surfaces is fabricated for semiconductor-level connection to a silicon-based trench capacitor. For example, as shown in FIGS. 1 and 2, chip 120 and chip 220 may be fabricated by step 505. Of course, chip 120 and chip 220 may be fabricated differently depending on the integration and how silicon-level connections are made between the respective chip and respective trench capacitors. Chip 220 may be fabricated with TSVs and/or other connections (e.g., pads, traces, solder bumps) in appropriate locations for surface mount trench capacitors, and may be fabricated with blind vias and/or other connections in appropriate locations for embedded trench capacitors.

At step 510, an optional TSI having first and second opposing surfaces is optionally fabricated for semiconductor-level connection between an active IC die and a silicon-based trench capacitor. For example, as shown in FIG. 1, TSI 130 may be fabricated with TSVs and/or other connections in appropriate locations for surface mount trench capacitors 110 mounted on the first and/or second surfaces of TSI 130, and TSI 130 may be fabricated with blind vias and/or other connections in appropriate locations for embedded trench capacitors.

At step 515, at least one silicon-based trench capacitor comprising an array of blind via trenches is fabricated for semiconductor-level connection to an active IC die. For example, as shown in FIGS. 3 and 4, trench capacitor 300 may be fabricated. When surface mounting trench capacitors on chip 120, chip 220 or TSI 130, trench capacitor 300 may be fabricated independently on a separate silicon wafer using a process specific to trench capacitors. When embedding trench capacitors on chip 120, chip 220 or TSI 130, trench capacitor 300 may be fabricated independently and inserted into a cavity in chip 120, chip 220, or TSI 130, or may be fabricated in place in chip 120, chip 220 or TSI 130.

At step 520, a silicon-level electrical connection between the active IC die and the at least one silicon-based trench capacitor is fabricated. For example, as shown in FIGS. 1 and 2, the silicon level connection between trench capacitor 110 and chip 120, or the silicon level connection between trench capacitor 210 and chip 220 is fabricated. Having fabricated conductive portions of trench capacitors and chips during their fabrication, creating an electrical connection between those conductive portions (e.g., TSVs, blind vias, microbumps, solder bumps) may occur, for example, by mounting (e.g., solder bumping) one or more of trench capacitor 110 or 210 onto one or more surfaces of chip 120 or 220, respectively, to complete the electrical connection. Alternatively, the process of embedding (not shown) one or more of trench capacitor 110 or 210 in one or more of chip 120 or 220, respectively, may complete the electrical connection.

At step 525, the composite structure or composite die comprising the active IC die and the at least one silicon-based trench capacitor is protected. Protection may be accomplished by underfilling, encapsulation, etc. For example, as shown in FIG. 1, trench capacitor 110, chip 120 and TSI 130 may have underfill and mold applied to protect over, around and/or under the composite structure. As shown in FIG. 2, trench capacitor 210 and chip 220 may have underfill and mold applied to protect over, around and/or under the composite die.

Figure 6A:
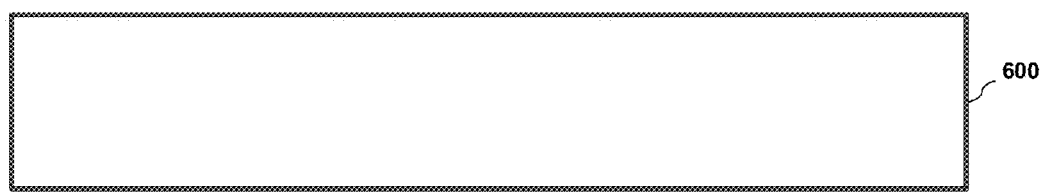
FIGS. 6A-6G show cross-sectional views of exemplary graphical depictions of fabrication and assembly structures in an exemplary embodiment of a method of fabricating a silicon-based trench capacitor.

FIGS. 6A-6G show exemplary detail of step 515. Specifically, FIGS. 6A-6G shows cross-sectional views of exemplary graphical depictions of fabrication and assembly structures in an exemplary embodiment of a method of fabricating a silicon-based trench capacitor. Processing may occur simultaneously on a number of trench capacitors formed on the same wafer. FIG. 6A shows a blank silicon wafer 600.

Figure 6B:
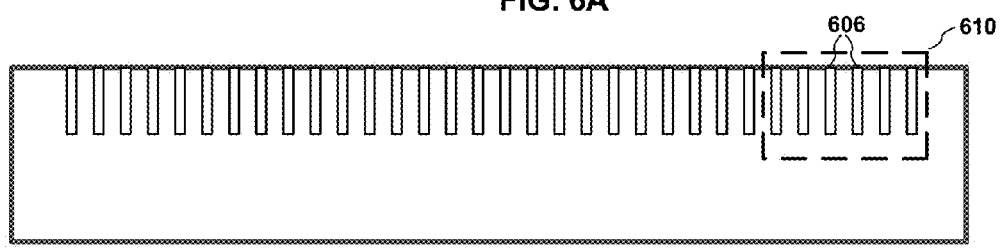

As shown in FIG. 6B, trenches 606 are formed in silicon wafer 600. Trenches 606 may be formed by lithographically patterning and etching silicon wafer 600. For example, deep reactive ion etching (DRIE) may be used to form high aspect ratio trenches. FIGS. 6C-6G focus on a portion 610 of silicon wafer 600 indicated in FIG. 6B.

Figure 6C:
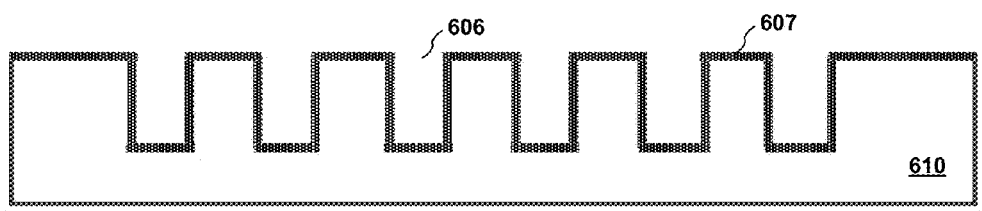

As shown in FIG. 6C, a first conductor (or bottom electrode) 607 is formed over silicon wafer, including in trenches 606. For example, low pressure chemical vapor deposition (LPCVD) may deposit highly conductive polysilicon to form first conductor (or bottom electrode) 607.

Figure 6D:
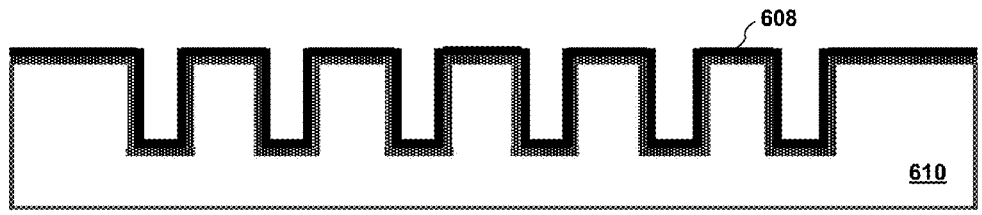

As shown in FIG. 6D, a thin, high permittivity dielectric 608 is formed over first conductor (or bottom electrode) 607. For example, a thermal oxide or oxide-nitride-oxide (ONO)

composite film may form dielectric 608. An ONO dielectric film may be as thin as approximately 1 nanometer (nm) without electrically leaking.

Figure 6E:
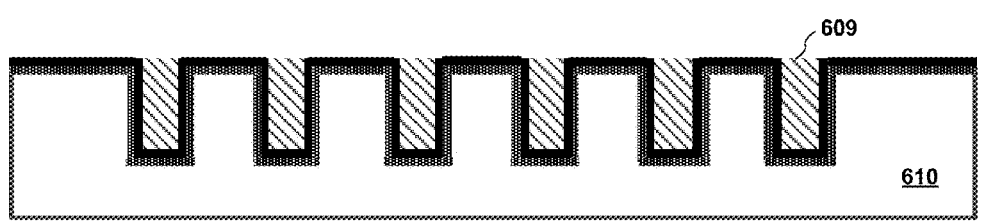

As shown in FIG. 6E, a second conductor (or top electrode) 609 is formed over dielectric 608. For example, copper may be electroplated and planarized by chemical-mechanical polishing (CMP) to form second conductor (or top electrode) 609.

Figure 6F:
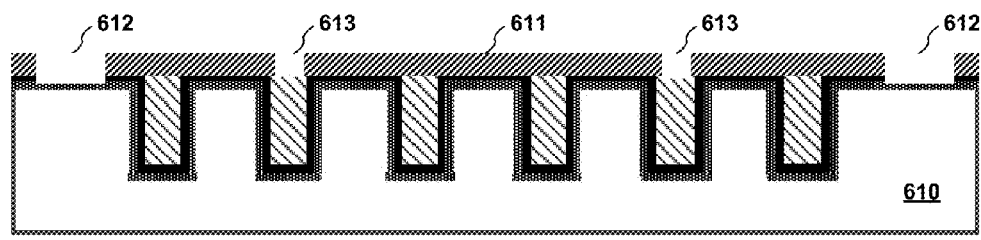

As shown in FIG. 6F, back end of line (BEOL) processing forms an insulative layer 611 and contact vias 612, 613 to first and second conductors 608, 609, respectively.

Figure 6G:
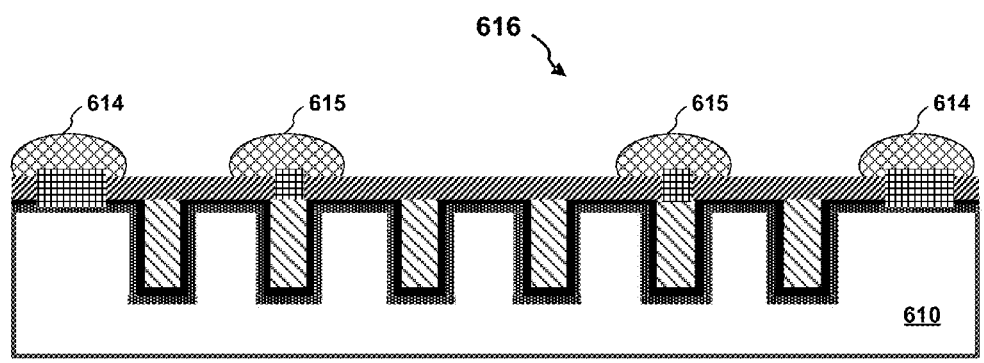

As shown in FIG. 6G, first and second contacts 614, 615 are formed for first and second conductors 608, 609, respectively. For example, under-bump metallization (UBM) and solder bumps may metallize contact vias 612, 613, respectively, and apply solder bumps to form first and second contacts 614, 615.

Although not shown, additional processing may thin silicon wafer 600 and dice silicon wafer 600 (e.g., at portion 610) into individual trench capacitors 616.

Figure 7A:
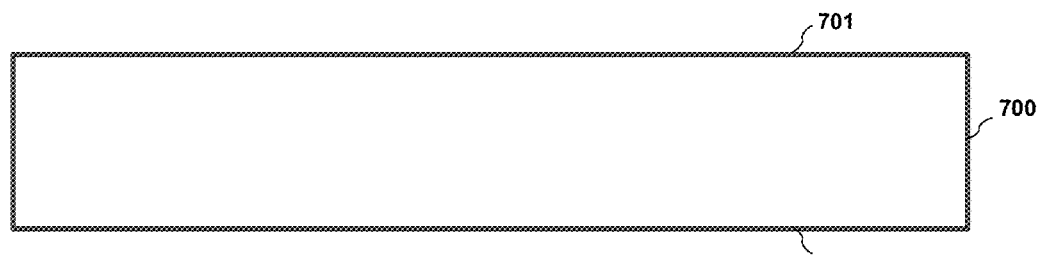
FIG. 7A-7N show cross-sectional views of exemplary graphical depictions of fabrication and assembly structures in an exemplary embodiment of a method of integrating a chip and a silicon-based trench capacitor using silicon-level connections.
Figure 7B:
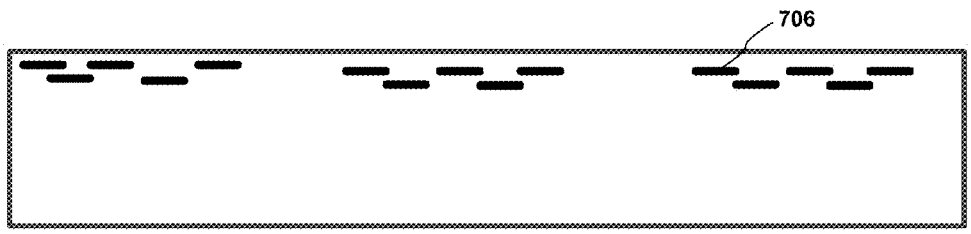
Figure 7C:
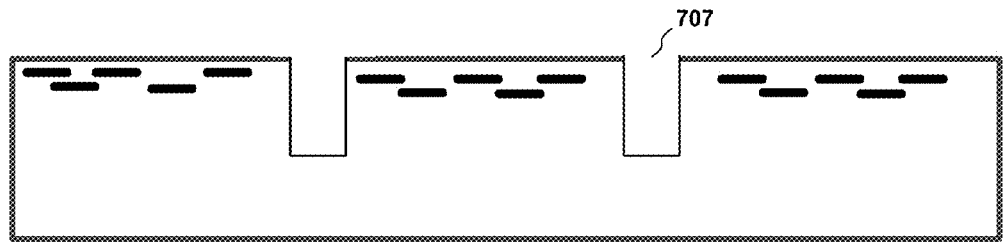
Figure 7D:
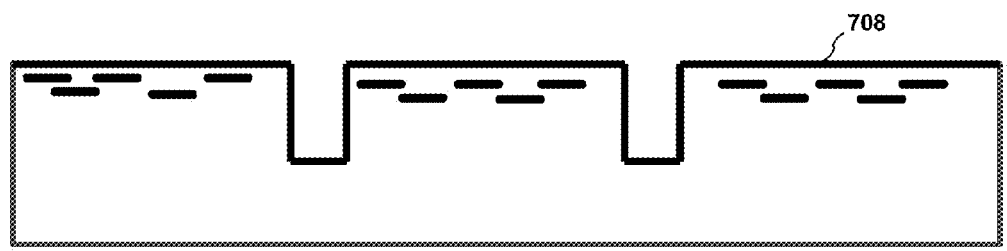
Figure 7E:
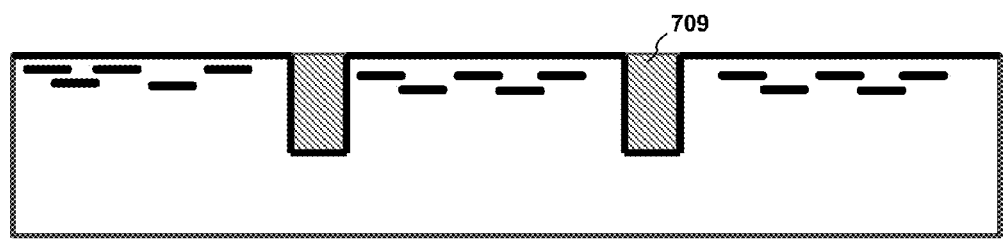
Figure 7F:
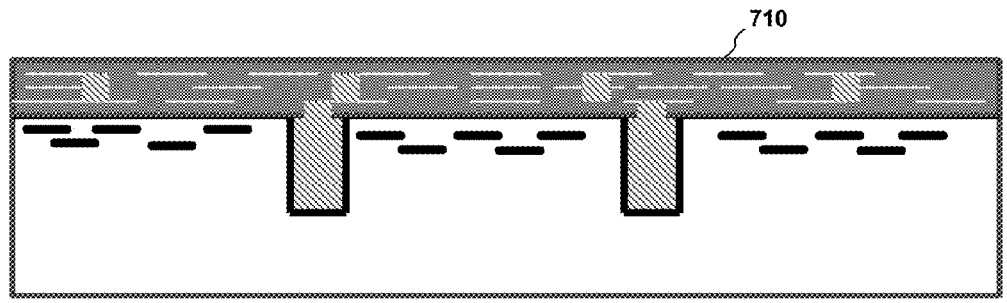
Figure 7G:
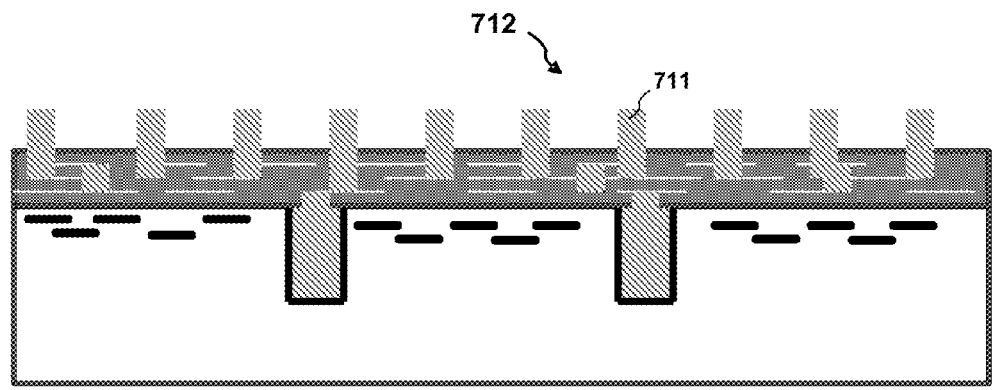
Figure 7H:
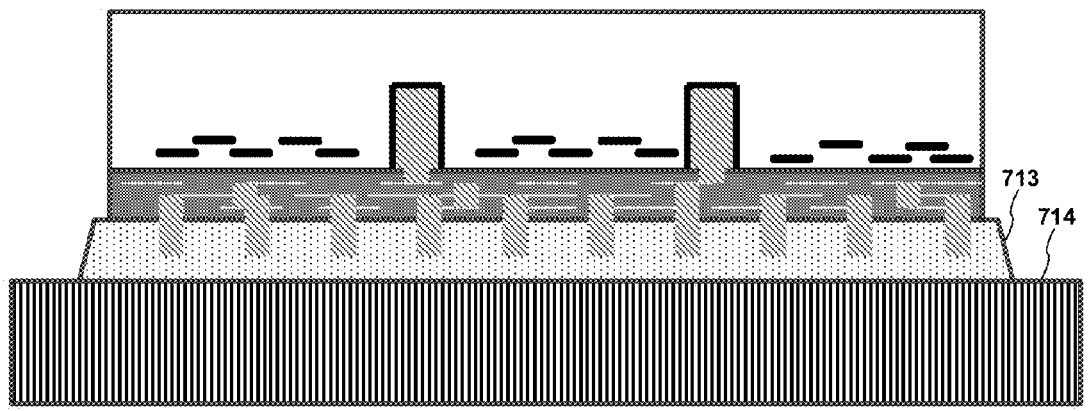
Figure 7I:
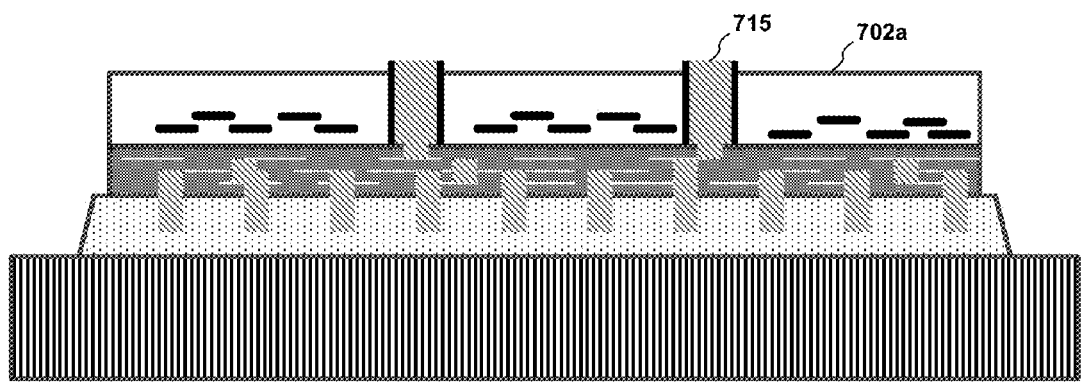
Figure 7J:
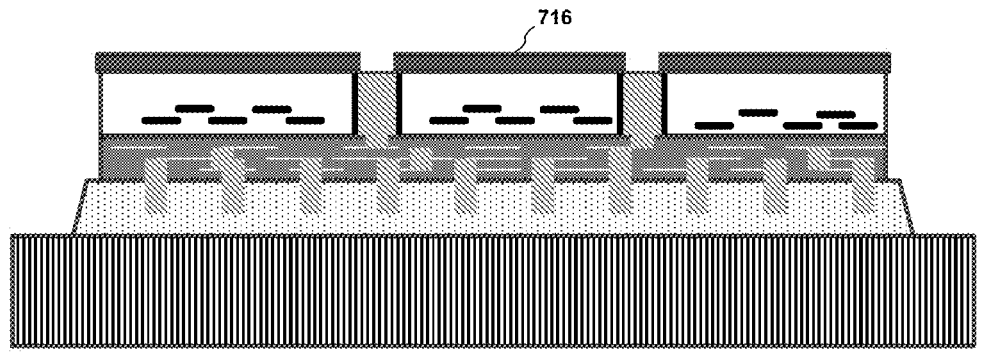
Figure 7K:
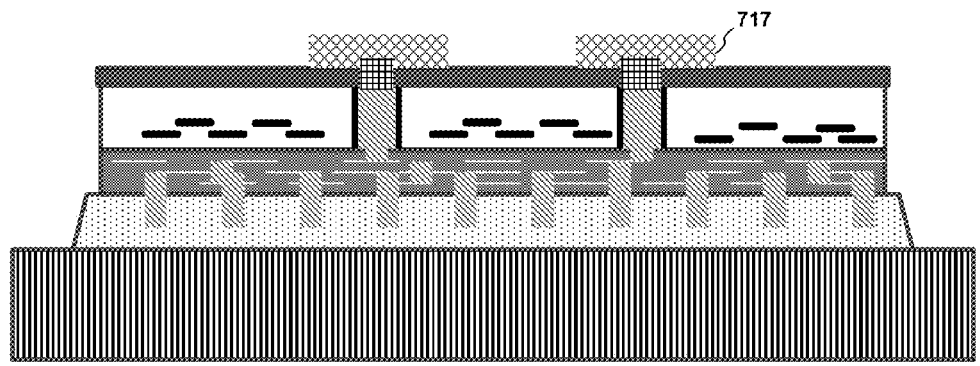
Figure 7L:
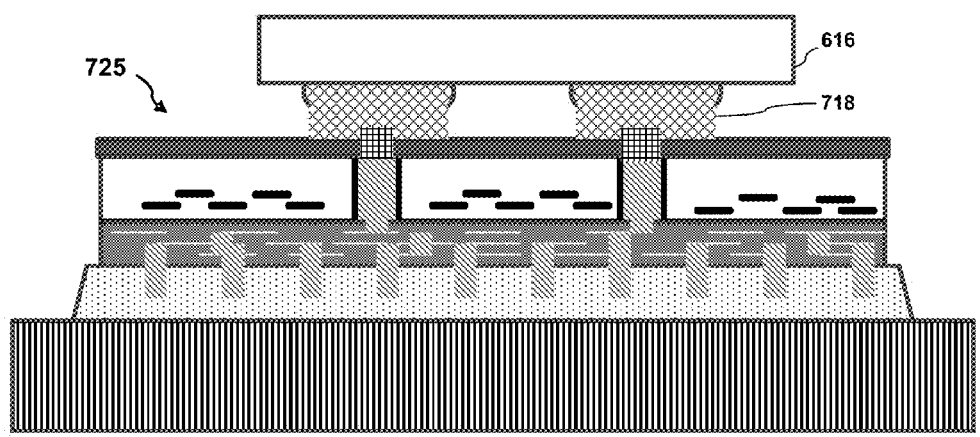
Figure 7M:
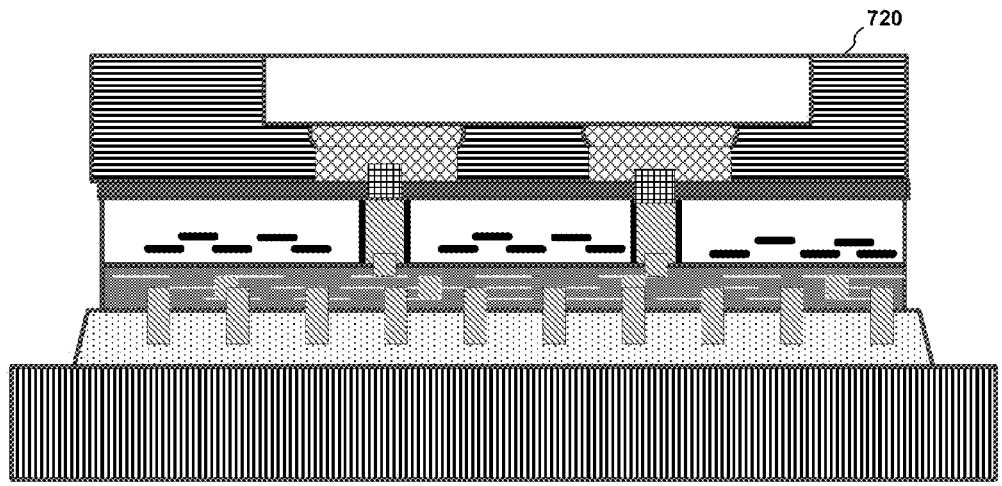
Figure 7N:
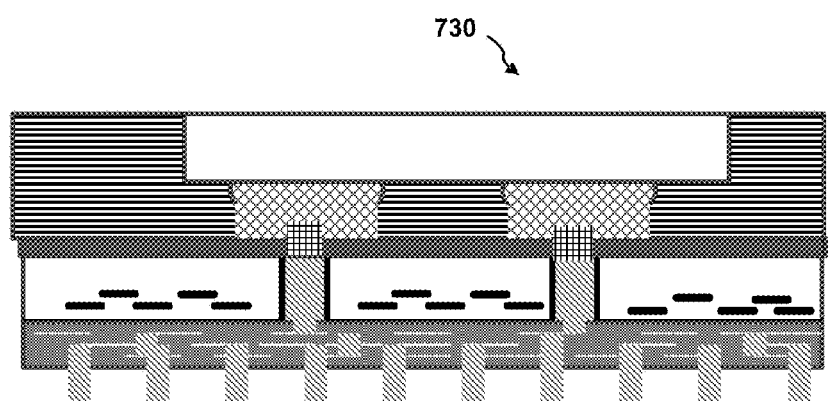

FIGS. 7A-7N provide exemplary detail of steps 505, 520 and 525. Specifically, FIGS. 7A-7N shows cross-sectional views of exemplary graphical depictions of fabrication and assembly structures in an exemplary embodiment of a method of integrating a chip and a silicon-based trench capacitor using silicon-level connections. Processing may occur simultaneously on a number of active IC dies formed on the same wafer. FIG. 7A shows a blank silicon wafer 700 having opposing first and second surfaces 701, 702.

As shown in FIG. 7B, an active circuitry 706 is formed on or under first surface 701 or in silicon wafer 700. For example, FEOL processing may form transistors circuits to form active circuitry 706.

As shown in FIG. 7C, holes or blind vias 707 are formed through first surface 701. For example, silicon wafer 700 may be lithographically patterned and etched to make holes 707. DRIE is one type of etching process that can make holes 707.

As shown in FIG. 7D, holes 707 may be insulated with a dielectric liner 708. For example, a chemical vapor deposition (CVD) process may develop an oxidation layer over holes 707 and active circuitry 706 to form dielectric liner 708.

As shown in FIG. 7E, a via conductor 709 is formed over dielectric liner 708 within holes 707. For example, copper may be electroplated over dielectric liner 708 in holes 707 to form via conductor 709. The copper may be annealed to stabilize the copper grains to avoid copper pumping during processing. The copper may be planarized by a CMP process. Of course, there may be more or fewer via conductors 709 than shown in FIG. 7E depending on the number and connection requirements of silicon-based trench capacitors to be coupled to active circuitry 706.

As shown in FIG. 7F, FEOL processing may continue to develop a stack 710 of metal layers with traces and vias separated by insulative layers. Each insulative layer may include an inter-layer dielectric (ILD) with low static permittivity.

As shown in FIG. 7G, contacts 711 are formed on the front side of active IC die 712. For example, UBM and solder bump processes may form copper pillars with solder tips to form contacts 711. Completion of contacts 711 completes active IC die 712. Active IC die 712 has been fabricated for semiconductor-level connection to a silicon-based trench capacitor as provided in step 505 of method 500. The preparation for a silicon-level connection includes via conductor 709. Via conductor 709 is a blind via. Depending on the integration with one or more silicon-based trench capacitors, via conductor 709 may remain a blind via for embedded trench capacitors or may become a TSV for surface mounted trench capacitors.

Further processing of active IC die 712 may form silicon-level electrical connections between active IC die 712 and at least one independently fabricated silicon-based trench capacitor 616.

As shown in FIG. 7H, a temporary adhesive 713 is applied to the front side of active IC die 712 in order to mount a temporary carrier wafer 714. Active IC die 712 is flipped over for additional processing on second surface 702.

As shown in FIG. 7I, second surface 702 is thinned to expose via conductor 709, which becomes a TSV 715. For example a dry etch process may be applied to create TSV 715 and thinned second surface 702a.

As shown in FIG. 7J, an insulative layer 716 is deposited over thinned second surface 702a. For example, a dielectric material may be deposited over thinned second surface 702a and TSV 715. The dielectric material may be patterned to open TSV 715. The insulative layer 716 may be applied by a low temperature application of a polymer such as polybenzoxazole (PBO).

As shown in FIG. 7K, a conductor may be deposited to extend TSV 715 above insulative layer 716 to form a metal pad 717. For example, a UBM process may form the metal pad 717 in a pattern consistent with solder bumps on silicon-based trench capacitor 616.

As shown in FIG. 7L, an electrical connection 718 is formed between at least one silicon-based trench capacitor 616 and active IC die 712 by mounting and electrically connecting at least one silicon-based trench capacitor 616 to active IC die 712 through a metal pad 717. For example, silicon-based trench capacitor 616 may be bumped onto active IC die 712. At this point in processing, wafer 700 has become a composite wafer 725.

As shown in FIG. 7M, composite wafer 725 may be protected by a molding material 720. For example, molding material 720 may fill the sides and underside of trench capacitor(s) 616 to protect the composite structures on composite wafer 725.

As shown in FIG. 7N, temporary adhesive 713 and temporary carrier wafer 714 are removed and additional processing dices composite wafer 725 into an individual composite die 730. Although not shown, further processing may package individual composite die 730. Alternatively, composite die 730 may be assembled without packaging. See, e.g., FIG. 1, showing active IC die or chip 120, such as composite die 730, mounted to TSI 130.

III. Conclusion

Methods, systems, and apparatuses are described for integration of integrated circuit die and silicon-based trench capacitors using silicon-level connections to reduce connection lengths, parasitics and necessary capacitance magnitudes and volumes. A trench capacitor can be fabricated on silicon and mounted on or embedded in a chip or one or more sides of a through silicon interposer (TSI) for silicon-level connections to chip circuitry. Aspect ratio dependent, as opposed to trench diameter or trench depth dependent, trench capacitors formed by a dense array of high aspect ratio trenches with thin, high permittivity dielectric increase capacitance per unit area and volume, resulting in thin, high capacitance trench capacitors having thickness equal to or less than chip thickness.

An advantage of silicon-based trench capacitors is that there is no thermal mismatch between capacitor silicon and active IC dies or TSIs or silicon-level connections between them. A further advantage of silicon-based trench capacitors is that they can be fabricated significantly thinner than discrete equivalents. This permits integration with active IC dies and TSIs. An advantage of fabricating silicon-based trench capacitors independently of an active IC die and TSIs is that decoupling capacitors can be made on separate silicon wafers using a process specific to trench capacitors. This permits process optimization. An advantage of placing active IC dies and TSIs in close proximity to silicon-based trench capacitors is silicon-level connections that result in shorter connections that do not go through packages. This reduces effective ESR and ESL. It also reduces the magnitude of capacitance required for decoupling. An advantage of high aspect ratio and thin, high permittivity dielectric silicon-based trench capacitors is that they can increase the capacitance per unit area and per unit volume.

Embodiments are not limited to the functional blocks, detailed examples, steps, order or the entirety of subject matter presented in the figures, which is why the figures are referred to as exemplary embodiments.

A device (i.e., an apparatus), as defined herein, is a machine or manufacture as defined by 35 U.S.C. §101. Devices may be digital, analog or a combination thereof. Devices may be implemented with any semiconductor process or semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented by hardware (digital and/or analog) or a combination of hardware and software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic (e.g., program modules) comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant arts) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device comprising:
    a through silicon interposer (TSI) having opposing first and second surfaces;
    an active integrated circuit (IC) die mounted to the first surface of the TSI;
    a first silicon-based trench capacitor embedded in the first surface of the TSI, the first silicon-based trench capacitor comprising a high aspect-ratio-dependent interconnected array of trench capacitors in a trench capacitor die independent of the active IC die and TSI; and
    a first silicon-level electrical connection without packaging between the active IC die and the first trench capacitor provided by the TSI.

2. The device of claim 1, wherein a thickness of the first silicon-based trench capacitor is equal to a thickness of the active IC die.

3. The device of claim 1, wherein the first silicon-based trench capacitor comprises an array of trenches connected together and wherein each trench in the array of trenches is a blind via having a high aspect ratio of trench depth to trench diameter and a thin dielectric.

4. The device of claim 1, further comprising:
    a substrate, wherein the second surface of the TSI is mounted to the substrate.

5. The device of claim 4, further comprising:
    a second silicon-based trench capacitor fabricated independent of the IC die, the second silicon-based trench capacitor mounted to the second surface of the TSI; and
    a second silicon-level electrical connection between the active IC die and the second trench capacitor provided by the TSI.

6. The device of claim 1, further comprising:
    a third silicon-based trench capacitor embedded in the active IC die.

7. A method comprising:
    fabricating an active integrated circuit (IC) die having first and second opposing surfaces;

fabricating a first silicon-based trench capacitor comprising an array of blind via trenches on a separate silicon wafer independent of the active IC die using a specific process for a high aspect-ratio-dependent interconnected array of trench capacitors;
embedding the first silicon-based trench capacitor in the active IC die; and
forming a first silicon-level electrical connection without packaging between the active IC die and the first silicon-based trench capacitor.

8. The method of claim 7, further comprising:
fabricating a composite die by:
mounting a second silicon-based trench capacitor to a first surface of the active IC die.

9. The method of claim 8, wherein forming the first silicon-level electrical connection comprises:
forming a through silicon via (TSV) in the active IC die; and
electrically connecting the first silicon-based trench capacitor and the active IC die through the TSV.

10. The method of claim 7, wherein the first silicon-based trench capacitor comprises shallow trenches.

11. The method of claim 7, further comprising:
mounting the active IC die and a second silicon-based trench capacitor to a through silicon interposer (TSI) having first and second opposing surfaces; and
forming in the TSI a second silicon-level electrical connection without packaging between the active IC die and the second silicon-based trench capacitor.

12. The method of claim 11, wherein the second silicon-based trench capacitor and the active IC die are mounted on the first surface of the TSI.

13. The method of claim 12, further comprising:
mounting a third silicon-based trench capacitor to the second surface of the TSI; and
mounting second surface of the TSI to a substrate.

14. The method of claim 11, further comprising:
embedding a third silicon-based trench capacitor in the TSI.

15. The method of claim 7, wherein forming the first silicon-level electrical connection comprises:
forming a via in the active IC die; and
electrically connecting the first silicon-based trench capacitor and the active IC die using the via.

16. A composite die comprising:
an active integrated circuit (IC) die;
a first silicon-based trench capacitor mounted to the active IC die, the first silicon-based trench capacitor comprising a high aspect ratio-dependent interconnected array of trench capacitors in a trench capacitor die independent of the active IC die; and
a silicon-level electrical connection without packaging between the active IC die and the first silicon-based trench capacitor.

17. The device of claim 16, wherein the silicon-level electrical connection comprises a via.

18. The device of claim 16, wherein each trench in the array of trenches is a blind via having a high aspect ratio of trench depth to trench diameter and a thin dielectric.

19. The device of claim 18, wherein a thickness of the first silicon-based trench capacitor is equal to a thickness of the active IC die.

20. The device of claim 16, wherein the composite die comprises a flip chip.

* * * * *